US009689659B2

(12) United States Patent
Teissier et al.

(10) Patent No.: US 9,689,659 B2
(45) Date of Patent: *Jun. 27, 2017

(54) METHOD OF DETECTING AN OBJECT WITH A PROXIMITY SENSOR

(71) Applicant: STMicroelectronics (Rousset) SAS, Rousset (FR)

(72) Inventors: Maxime Teissier, Tokyo (JP); Cyril Troise, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 317 days.

This patent is subject to a terminal disclaimer.

(21) Appl. No.: 14/509,920

(22) Filed: Oct. 8, 2014

(65) Prior Publication Data

US 2015/0025827 A1 Jan. 22, 2015

Related U.S. Application Data

(63) Continuation of application No. 13/197,619, filed on Aug. 3, 2011.

(30) Foreign Application Priority Data

Aug. 4, 2010 (FR) ...................................... 10 03270

(51) Int. Cl.
*G01B 7/14* (2006.01)
*G01V 3/08* (2006.01)
*H03K 17/945* (2006.01)
*H03K 17/955* (2006.01)
*G01B 7/00* (2006.01)

(52) U.S. Cl.
CPC ............... *G01B 7/14* (2013.01); *G01B 7/003* (2013.01); *G01V 3/088* (2013.01); *H03K 17/945* (2013.01); *H03K 17/955* (2013.01); *H03K 2217/960705* (2013.01)

(58) Field of Classification Search
CPC ........ G01B 7/003; G01B 7/14; H03K 17/945; H03K 17/955; G01V 3/088
See application file for complete search history.

(56) References Cited

U.S. PATENT DOCUMENTS

| 6,452,514 | B1 * | 9/2002 | Philipp | ................ | G01D 5/2405 |
| | | | | | 178/18.06 |
| 2003/0210235 | A1 * | 11/2003 | Roberts | ................. | G06F 3/0414 |
| | | | | | 345/173 |
| 2004/0066507 | A1 * | 4/2004 | Kren | ................... | G01N 21/9501 |
| | | | | | 356/237.4 |

(Continued)

Primary Examiner — Hyun Park
Assistant Examiner — Laim R Casey
(74) Attorney, Agent, or Firm — Seed IP Law Group LLP

(57) ABSTRACT

The disclosure relates to a method of detecting an object using a detection signal supplied by a proximity sensor. The method comprises the steps of generating a reference signal by filtering the value of the detection signal, defining a first detection threshold, and going from an object non-detecting state to an object detecting state when the value of the detection signal becomes greater than the first detection threshold. When the value of the detection signal becomes greater than the first detection threshold, the value of the reference signal is readjusted in a manner such that the value of the detection signal again becomes less than or respectively greater than, the first detection threshold.

22 Claims, 7 Drawing Sheets

(56) References Cited

U.S. PATENT DOCUMENTS

| | | | |
|---|---|---|---|
| 2005/0146512 A1* | 7/2005 | Hill | G06F 3/0436 345/173 |
| 2006/0227115 A1* | 10/2006 | Fry | H03K 17/962 345/173 |
| 2006/0267953 A1* | 11/2006 | Peterson, Jr. | G06F 3/0418 345/173 |
| 2009/0073140 A1 | 3/2009 | Fujita et al. | |
| 2009/0273340 A1 | 11/2009 | Stephanson et al. | |
| 2010/0060270 A1 | 3/2010 | Gong et al. | |
| 2010/0259283 A1 | 10/2010 | Togura | |
| 2011/0063993 A1* | 3/2011 | Wilson | G06F 3/044 370/254 |
| 2011/0216016 A1* | 9/2011 | Rosener | G06F 3/041 345/173 |
| 2011/0241907 A1* | 10/2011 | Cordeiro | G06F 3/0418 341/20 |
| 2012/0043970 A1* | 2/2012 | Olson | G01R 27/2605 324/601 |
| 2012/0043976 A1* | 2/2012 | Bokma | H03K 17/955 324/679 |

\* cited by examiner

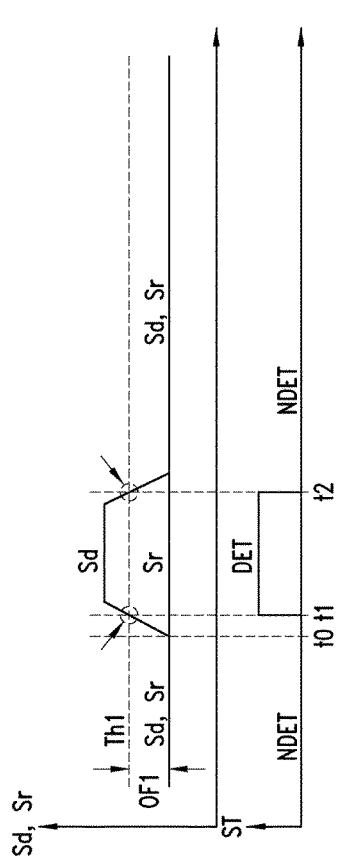
FIG. 2A
(Prior Art)
FIG. 2B
(Prior Art)
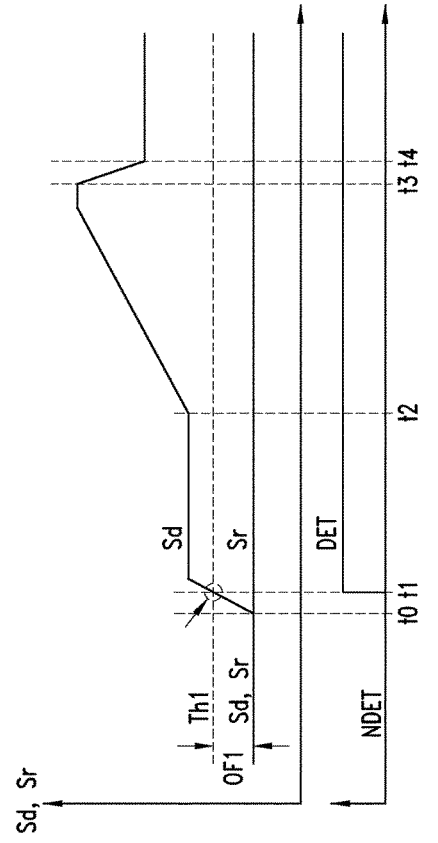
FIG. 3A
(Prior Art)
FIG. 3B
(Prior Art)

METHOD OF DETECTING AN OBJECT WITH A PROXIMITY SENSOR

BACKGROUND

Technical Field

The present disclosure relates to a method of detecting an object by means of a detection signal supplied by a proximity sensor.

The present disclosure relates in particular to object detectors comprising a proximity sensor of the capacitive type.

Description of the Related Art

FIG. 1 schematically shows a conventional proximity detector DTC1. Detector DTC1 comprises a proximity sensor controller 10, a sensitive portion 11, and a signal processing unit SPU1. Sensor controller 10 comprises electronic means of controlling and of reading sensitive portion 11, supplying a detection signal Sd. Signal Sd has a value, for example its amplitude, that varies as a function of the distance separating an object 12 from sensitive portion 11. The value of signal Sd also evolves depending on various environmental parameters such as the temperature, the dielectric constant of air which is a function of the ambient humidity, the proximity of objects other than the detected object, etc.

Unit SPU1 ensures the processing of signal Sd and supplies a state signal ST having two values DET and NDET, respectively signifying "object detected" or "object not detected".

A conventional processing method of signal Sd as executed by unit SPU1 is shown in FIGS. 2A, 2B. It is supposed here that signal Sd has a value that increases as the object approaches sensor 10. The method comprises the following steps:

unit SPU1 calculates a reference signal Sr, the value of which varies more slowly than that of signal Sd, for example by low-pass filtering of signal Sd, unit SPU1 defines a detection threshold Th1 greater than reference signal Sr, for example by adding an offset OF1 to the value of reference signal Sr, when the value of signal Sd becomes greater than threshold Th1, unit SPU1 goes from non-detecting state NDET to detecting state DET and freezes the value of reference signal Sr, when the value of signal Sd again becomes less than threshold Th1, unit SPU1 goes back into non-detecting state NDET and releases reference signal Sr, which is again dynamically generated by filtering of signal Sd.

In the example shown in FIG. 2A, signal Sd begins to increase at an instant t0 and reaches threshold Th1 at an instant t1. Signal Sr does not vary perceptibly between t0 and t1 because it only copies the slow variations of signal Sd. Signal Sr is then locked (i.e., frozen) from instant t1 until an instant t2 where signal Sd again becomes less than Th1. After instant t2, signal Sr still does not vary perceptibly because it does not copy the falling edge of short duration of signal Sd.

In a variant of this method, sensor controller 10 supplies a signal Sd, the value of which decreases as object 12 approaches the sensor. Detection threshold Th1 is in this case chosen to be less than reference signal Sr and the detector goes into detecting state DET when the value of signal Sd becomes less than threshold Th1.

In such a method, the freezing of reference signal Sr prevents it from slowly approaching detection signal Sd, which would cause an undesirable return to the non-detecting state. Indeed, threshold Th1 would increase with signal Sr and detection signal Sd would find itself, at one time or another, less than threshold Th1.

Such a detecting method is satisfactory when the detecting time of an object is short. However, in certain applications where the object detecting time may be long, a modification of environmental parameters during the detection period of an object may lead to the detector becoming blocked.

FIGS. 3A, 3B illustrate this problem. The value of signal Sd begins to increase at an instant t0 and reaches threshold Th1 at an instant t1, causing the freezing of signal Sr (FIG. 3A). The detector goes from non-detecting state NDET to detecting state DET (FIG. 3B). At an instant t2, the environmental parameters change and cause a new increase of the signal Sd value, unrelated to a displacement of the object. At an instant t3, the object leaves the field of detection of the sensor or ceases to be in contact with the sensor. The value of signal Sd decreases to reach, at an instant t4, a lower value representative of the non-detecting state. This lower value is however greater than threshold Th1 due to the change of environmental parameters. The detector thus remains blocked in the detecting state.

This problem has been for example noticed in the following applications:

A proximity detector is integrated in the headphones of a digital music player. The detector allows the sound to be stopped automatically when the user is no longer wearing the headphones. It has been noted that the formation or deposition of humidity on the sensitive surface of the sensor, for example due to transpiration by the user, causes the value of detection signal Sd to increase. When the user removes the headphones, the value of signal Sd remains high, as shown in FIG. 3A, and the proximity detector remains in the detecting state.

A proximity detector is integrated in a mobile telephone equipped with a touch pad. During a telephone conversation, the detector is used to lock the touch pad and/or set the screen in low consumption mode when the user approaches the telephone to his ears. It has also been noted that the detector may be blocked in the detecting state after the deposition or the formation of humidity on the sensitive portion of the sensor. This may happen during a telephone conversation or due to the fact that the telephone has suddenly changed environments (for example after having been placed in a humid room such as a bathroom). In this case, the touchpad remains untimely locked, preventing the user from using the telephone.

It may therefore be desired to provide a method of detecting an object that is more resistant to variations of environmental parameters affecting the detection signal.

BRIEF SUMMARY

More particularly, embodiments of the disclosure relate to a method of detecting an object by means of a detection signal supplied by a proximity sensor, the detection signal having a value that increases, or respectively decreases, as a function of the proximity of a detected object, the method comprising the steps of generating a reference signal by filtering the value of the detection signal, defining a first detection threshold relative to the reference signal, and going from an object non-detecting state to an object detecting state when the value of the detection signal becomes greater than, or respectively less than, the first detection threshold, wherein when the value of the detection signal becomes greater than, or respectively less than, the first detection threshold, the value of the reference signal is readjusted in a manner such that the value of the detection signal again becomes less than, or respectively greater than, the first detection threshold.

According to one embodiment, the method comprises a step of again readjusting the value of the reference signal in a manner such that the value of the detection signal again becomes less than, or respectively greater than, the first detection threshold when, in the object detecting state, the value of the detection signal again becomes greater than, or respectively less than, the first detection threshold.

According to one embodiment, the method comprises the steps of defining a second detection threshold relative to the reference signal, going from the object detecting state to the object non-detecting state when the value of the detection signal becomes less than, or respectively greater than, the second detection threshold, and when the value of the detection signal becomes less than, or respectively greater than, the second detection threshold, readjusting the value of the reference signal in a manner such that the value of the detection signal again becomes greater than, or respectively less than, the second detection threshold.

According to one embodiment, the method comprises a step of again readjusting the value of the reference signal in a manner such that the value of the detection signal again becomes greater than, or respectively less than, the second detection threshold when, in the object non-detecting state, the value of the detection signal again becomes less than, or respectively greater than, the second detection threshold, without modifying the non-detecting state.

According to one embodiment, the second detection threshold is equal to the value of the reference signal from which an offset is subtracted, or respectively to which an offset is added.

According to one embodiment, the first detection threshold is equal to the value of the reference signal to which an offset is added, or respectively from which an offset is subtracted.

According to one embodiment, the readjustment of the value of the reference signal is done in a manner such that the value of the detection signal is substantially equal to the value of the reference signal with a maximum deviation less than the difference between the value of the readjusted reference signal and the detection threshold, the crossing of which causes the readjustment of the reference signal.

According to one embodiment, the readjustment of the value of the reference signal is done from values of the detection signal after the instant where the value of the detection signal becomes greater than or less than the threshold.

According to one embodiment, the value of the detection signal is an amplitude, a frequency, a phase, a duration, or a number.

According to one embodiment, the step of going from the object detecting state to the object non-detecting state, or vice-versa, comprises a step of modifying the value of a state signal or a state register.

According to one embodiment, the object to detect is a part of the human body.

According to one embodiment, the detection signal is supplied by a capacitive proximity sensor.

Embodiments of the disclosure relate to a computer program product, comprising an executable code saved on a support to implement the method according to one of the embodiments described above.

Embodiments of the disclosure relate to a proximity detector comprising a proximity sensor supplying a detection signal having a value that increases, or respectively decreases, when an object approaches or touches the sensor, a processing unit of microprocessor or hard-wired type, receiving the detection signal, wherein the processing unit is configured to implement the method according to one of the embodiments described above.

Embodiments of the disclosure relate to a portable device having at least one element that can be activated and deactivated, and comprising at least one detector according to the embodiment described above and being configured to activate or deactivate the element when an object is detected in proximity of the device.

BRIEF DESCRIPTION OF THE SEVERAL VIEWS OF THE DRAWINGS

Embodiments of the method of detecting an object according to disclosure and of an object detector according to disclosure will be described in the following by reference, in a non-limiting manner, to the appended drawings among which:

FIGS. 2A, 2B previously described show signals appearing in the detector in the absence of variations of environmental parameters, FIGS. 3A, 3B previously described show a second example of signals appearing in the detector in the presence of a variation of environmental parameters, FIG. 4 schematically shows a detector configured to implement the method of the disclosure.

DETAILED DESCRIPTION

Figure 1:
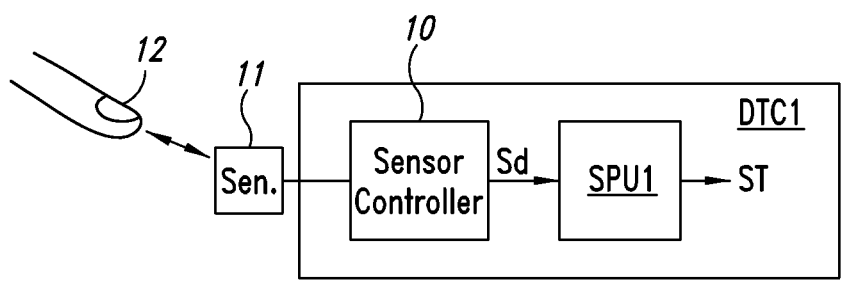
FIG. 1 previously described schematically shows a conventional object detector.
Figure 4:
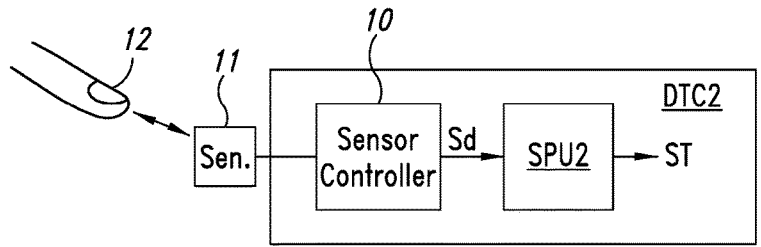

FIG. 4 schematically shows a detector DTC2 configured to implement an embodiment of the method of detecting an object according to disclosure. Detector DTC2 comprises a proximity sensor controller 10, a sensitive portion 11, for example of the capacitive type, and a processing unit SPU2. Sensor controller 10 comprises electronic means of controlling and of reading the sensitive portion 11, supplying a detection signal Sd in analog or digital form. Signal Sd has a value that varies between a minimum value Sdmin and a maximum value Sdmax as a function of the distance separating an object 12 from sensitive portion 11. According to the type of sensor used and the electronic control means structure, this value may be an amplitude (of voltage or of current), a frequency, a phase, a duration, or a number, for example a number of pulses or of cycles to transfer an electric charge.

The value of signal Sd also depends on environmental parameters such as the temperature, the dielectric constant of air or the ambient humidity, the proximity of objects other than the object to detect, etc.

Unit SPU2 may be an analog circuit, a hard-wired circuit, or a microprocessor or microcontroller circuit. It ensures the processing of detection signal Sd according to the method of the disclosure and supplies a state signal ST having two values, DET and NDET, respectively signifying "object detected" or "object not detected". State signal ST may be an analog or digital signal supplied by unit SPU2, a value in a read-accessible state register, or both.

Figure 5:
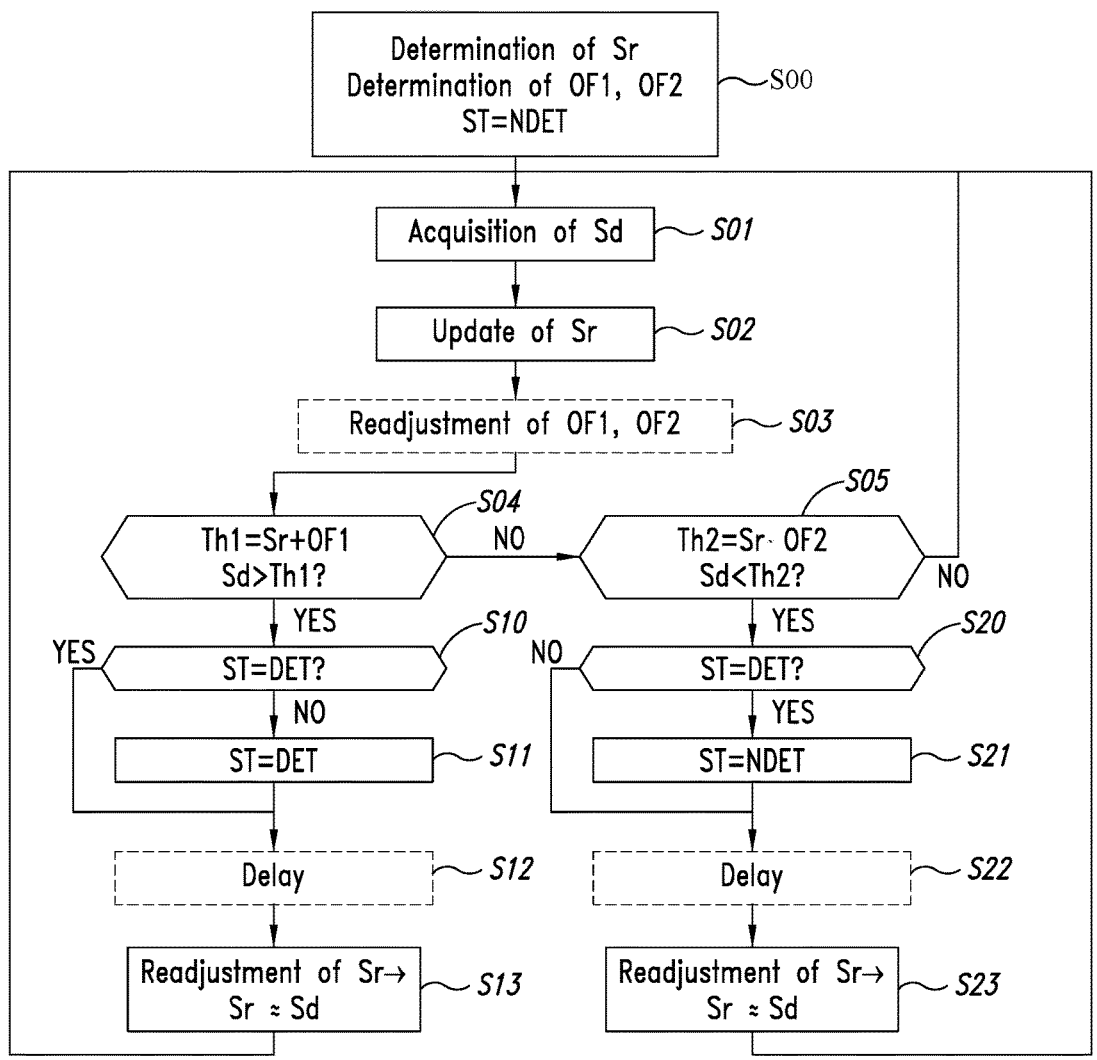
FIG. 5 is a flow chart describing an embodiment of the method of the disclosure.

An embodiment of the method according to disclosure is shown by the flow chart of FIG. 5. It is supposed in this example that the value of detection signal Sd increases when an object to detect approaches sensitive portion 11. It is also supposed here that the processing of signal Sd is done by digital calculation, by means of a processor arranged in processing unit SPU2, equipped with a programmed non-volatile memory and a volatile memory (not shown). The programmed memory receives an executable program implementing the method. Signal Sd may be supplied by sensor controller 10 in analog or digital form. In the first case, signal Sd is sampled by unit SPU2, with a sampling frequency Fs. In the second case, it is supplied in a digital form by the sensor with a refresh frequency Fs.

The method comprises an initialization step S00 and an object detecting loop comprising steps S01 to S23.

Initialization step S00 comprises a step of determining an initial value of a reference signal Sr, a step of determining two offsets OF1, OF2, and a step of initializing state signal ST.

The step of determining an initial value of reference signal Sr comprises a step of filtering detection signal Sd. Unit SPU2 uses for example a unity gain second order digital low-pass filter of the "Infinite Impulsion Response" IRR type, having a time constant T1. This step is performed during the time used to receive a sufficient number of values of signal Sd, for example between 8 and 128 values.

The step of determining offsets OF1, OF2 may comprise a step of reading offsets OF1, OF2 in memory zone where they are pre-stored. It may also include defining the offsets in a dynamic manner by taking into consideration the value of detection signal Sd to automatically adjust the sensibility of the detector to the usage conditions. For example, unit SPU2 confers higher values to the offsets when the value of signal Sd is high, and lower values when the value of signal Sd is low. To this end, unit SPU2 may use a mathematical function that allows it to calculate the offsets as a function of the value of signal Sr. Alternatively, unit SPU2 may use a correspondence table pre-saved in the processor memory, comprising a finite number of offset values, each corresponding to a value or to a range of values of the detection signal.

The step of initializing state signal ST consists of setting it, by default, in a non-detecting state NDET.

Once these preliminary steps have been executed, the object detection loop is executed and repeated as long as detector DTC2 is active. It comprises steps S0, S02, S03, S04, S05, S10, S11, S12, S13, S20, S21, S22, and S23.

At step S01, unit SPU2 acquires a new value of signal Sd, supplied by sensor 10.

At step S02, unit SPU2 updates the current value of signal Sr by filtering signal Sd including the new value received. This step is not necessarily performed after each acquisition of a new value of signal Sd and may done every N acquisitions, that is, at a frequency Fs/N.

At step S03, unit SPU2 readjusts offsets OF1, OF2 by taking into consideration the new value of signal Sd. Like step S02, this step is not necessarily performed after each acquisition of a new value of signal Sd and may be done every M acquisitions of new values, that is at a frequency Fs/M, M may be equal to N. This step may also not be executed if the offsets are not dynamically adjusted.

At step S04, unit SPU2 calculates a first detection threshold Th1 and determines whether the current value of detection signal Sd is greater than threshold Th1. threshold Th1 is calculated by adding offset OF1 to the current value of reference signal Sr, that is if Th1=Sr+OF1. If signal Sd is greater than Th1, unit SPU2 goes to step S10, otherwise to step S05.

At step S05, unit SPU2 calculates a second detection threshold Th2 and determines whether the current value of detection signal Sd is less than threshold Th2. threshold Th2 is calculated by subtracting offset OF2 from the current value of signal Sr, that is Th2=Sr−OF2. If signal Sd is less than Th2, unit SPU2 goes to step S20, otherwise it returns to step S01.

At step S10, unit SPU2 determines whether the detector is in state DET, that is if ST=DET. If the response is negative, unit SPU2 goes to step S11 where it puts the detector in state DET, then goes to step S12. If the response is positive, unit SPU2 goes directly to step S12.

Step S12 is an optional delaying step before executing step S13.

At step S13, unit SPU2 readjusts signal Sr then returns to step S01. Step S13 may comprise a readjustment calculation phase followed by the readjustment itself of signal Sr at the end of step S13, as it will appear later in relation with FIGS. 6A to 7B. The readjustment may therefore be done in a quasi-instantaneous manner at the end of step S13, but may also be done in a progressive manner throughout step S13.

At step S20, unit SPU2 determines whether the detector is in state DET, that is if ST=DET. If the response is positive, unit SPU2 goes to step S21 where it puts the detector in state NDET, then goes to step S22. If the response is negative, unit SPU2 goes directly to step S22.

Step S22 is, like step S12, an optional delaying step before executing step S23.

At step S23, unit SPU2 readjusts signal Sr then returns to step S01.

In summary, readjustment step S13 or S23 intervenes after detection signal Sd has reached threshold Th1 or Th2. The reaching of threshold Th1 also causes the detector to switch into state DET if it is not already (step S11), and the reaching of threshold Th2 causes the detector to switch into state NDET if it is not already (step S21).

The aim of the readjustment step of signal Sr is that signal Sd is again less than threshold Th1 that it reached (step S13) or again greater than threshold Th2 that it reached (step S23).

To this end, processing unit SPU2 tries to bring reference signal Sr to a value as close as possible to that of detection signal Sd. It may be that an exact equality between the two signals cannot be obtained due to rapid fluctuations of signal Sd during the readjustment phase, linked to the usage conditions (for example the distance between the detected object and the sensor changes constantly). Thus, in the presence of fluctuations of signal Sd, a deviation of signal Sr relative to signal Sd may be noted at the end of the readjustment step. This deviation should in practice be less than the difference between the value of readjusted signal Sr and the threshold that it reached, that is to say, less than offset OF1 or OF2.

The readjustment step of signal Sd is preferably done by disregarding instantaneous variations of signal Sd, such as possible parasitic oscillations, which may falsify the readjustment of signal Sr. It comprises for example a calculation of the average value of signal Sd, based on the signal Sd values received during the readjustment period, that is, after the reaching of threshold Th1 or Th2. It may also comprise the application of a filtering function to signal Sd, to obtain the readjusted signal Sr. This filtering may be of the same type as that implemented during steps S00 and S02, but with a lower time constant T2 in order to readjust as quickly as possible the signal Sr value.

The duration of the readjustment step determines, in relation with sampling or refresh frequency Fs of signal Sd, the number of signal Sd values used to readjust signal Sr. This duration may be chosen to be longer if no delaying step S12 or S22 is provided. The choice of the duration of readjustment steps S13 or S23 and of delaying steps S12 or S22 is within the purview of the skilled person and may vary according to the intended application.

At the end of the readjustment step, reference signal Sr thus again finds itself set on detection signal Sd, which allows detector DCT2 to adapt to environmental conditions susceptible of making detection signal Sd vary while the detector is in the detecting state.

Two examples illustrating the functioning of detector DTC2 will now be described in relation with FIGS. 6A, 6B and 7A, 7B which show two different scenarios.

Figures 6A, 6B:
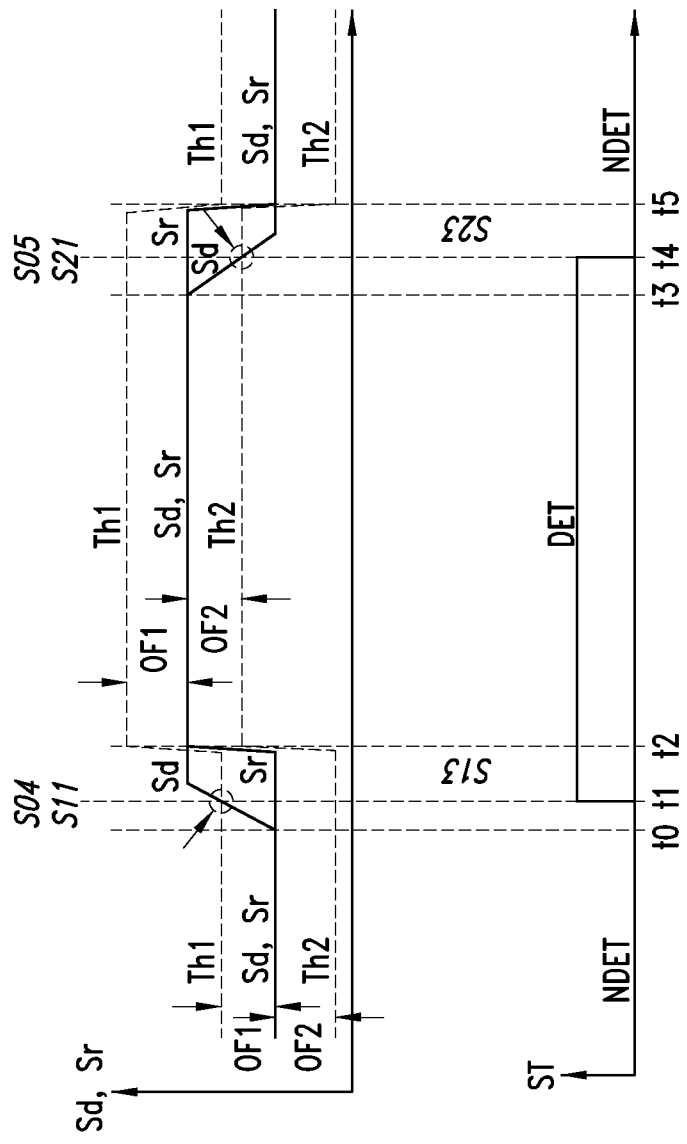
FIGS. 6A, 6B show signals appearing in the detector of FIG. 4 in the absence of variations of environmental parameters.

The scenario illustrated in FIGS. 6A, 6B corresponds to the case where the environmental parameters do not vary significantly while the detector detects an object. It is supposed in this example that delaying steps S12, S22 are not implemented.

Figures 7A, 7B:
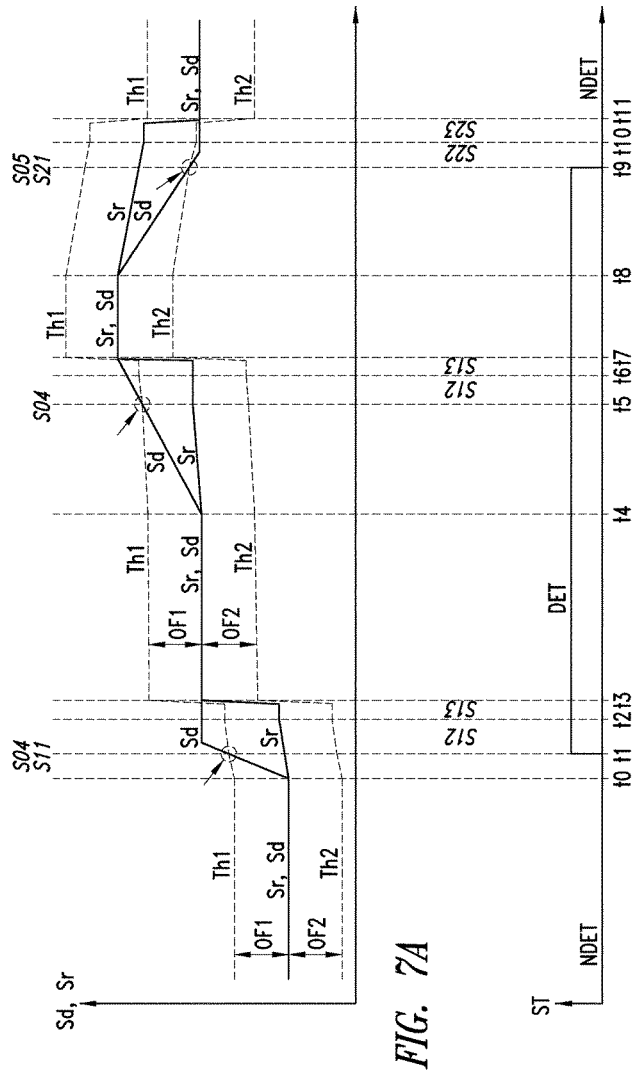
FIGS. 7A, 7B show signals appearing in the detector of FIG. 4 in the presence of a variation of environmental parameters.

The scenario shown in FIGS. 7A, 7B corresponds to the case where a sudden variation of environmental parameters intervenes while the detector detects an object.

FIGS. 6A, 7A show signals Sd, Sr and thresholds Th1, Th2. FIGS. 6B, 7B show values DET or NDET of state signal ST at different instants.

Scenario 1, FIGS. 6A, 6B

At instant t0, an object approaches the detector and the value of signal Sd begins to increase. Signal Sr varies little due to the filtering time constant, this variation not being shown in FIG. 6A for the sake of simplicity. At instant t1, the value of signal Sd reaches threshold Th1, which is detected at step S04 and causes the detector to go into state DET at step S11 (steps S04, S11 being considered here as quasi-simultaneous). Between instant t1 and an instant t2, the detector executes readjustment step S13 and signal Sd is brought to a value substantially equal to that of signal Sr at the end of step S13. Signal Sd goes back below threshold Th1. At instant t3, the object moves away from the detector and the value of signal Sd begins to decrease. At an instant t4, the value of signal Sd reaches threshold Th2, which is detected at step S05 and causes the detector to go into state NDET at step S21. Between instant t4 and an instant t5, the detector executes the readjustment step S23 and signal Sd is again brought to a value substantially equal to that of signal Sr at the end of step S23.

It is therefore noted that the detector has a hysteresis response with automatic adjustment of signal Sr as a central detection threshold around which detecting thresholds Th1, Th2 articulate, defining this hysteretic response. In the absence of sudden variations of environmental parameters during the object detection phase, this hysteretic response with automatic adjustment of the central threshold does not offer a new technical effect relative to the method shown in FIGS. 2A, 2B. It is otherwise in the case of the scenario illustrated in FIGS. 7A, 7B, which will now be described.

Scenario 2, FIGS. 7A, 7B

At instant t0, an object approaches the detector and the value of signal Sd begins to increase, whereas signal Sr does not perceptibly change due to the filtering time constant. At an instant t1, the value of signal Sd reaches threshold Th1, which is detected at step S04 and causes the detector to go into state DET at step S11. Between instant t1 and an instant t2, the detector counts a wait time (step S12) in order to allow signal Sd to stabilize. Between instant t2 and an instant t3, the detector executes the readjustment step S13 and signal Sd is brought to a value substantially equal to that of signal Sr at the end of step S13. Signal Sd goes back therefore below threshold Th1.

At an instant t4, the object still being present, the environmental parameters change and cause the value of detection signal Sd to increase, whereas signal Sr does not substantially change due to the filtering time constant. At an instant t5, the value of signal Sd again reaches threshold Th1, which is detected at step S04, without causing the detector state to change because it is already in state DET (goes directly from step S10 to step S12). Between instant t5 and an instant t6, the detector counts a wait time (step S12) in order to allow signal Sd to stabilize. Between instant t6 and an instant t7, the detector executes readjustment step S13 and signal Sd is again brought to a value substantially equal to that of signal Sr at the end of step S13. Signal Sd goes back below threshold Th1.

At an instant t8, the object moves away from the detector and the value of signal Sd begins to decrease, while the new environmental parameters continue to affect signal Sd. At an instant t9, the value of signal Sd reaches threshold Th2, which is detected at step S05 and causes the detector to go into state NDET at step S21. Between instant t9 and an instant t10, the detector counts a wait time (step S22) in order to let signal Sd stabilize. Between instant t10 and an instant t11, the detector executes a readjustment step S23 and signal Sd is again brought to a value substantially equal to that of signal Sr at the end of step S23.

In contrast with the example shown in FIGS. 3A, 3B, this example shows that the hysteretic response of the detector with automatic adjustment of reference signal Sr, allows it to automatically adapt to variations of environmental parameters without affecting its ability to detect variations of signal Sd representative of an object to detect being moved closer or farther.

Figure 8:
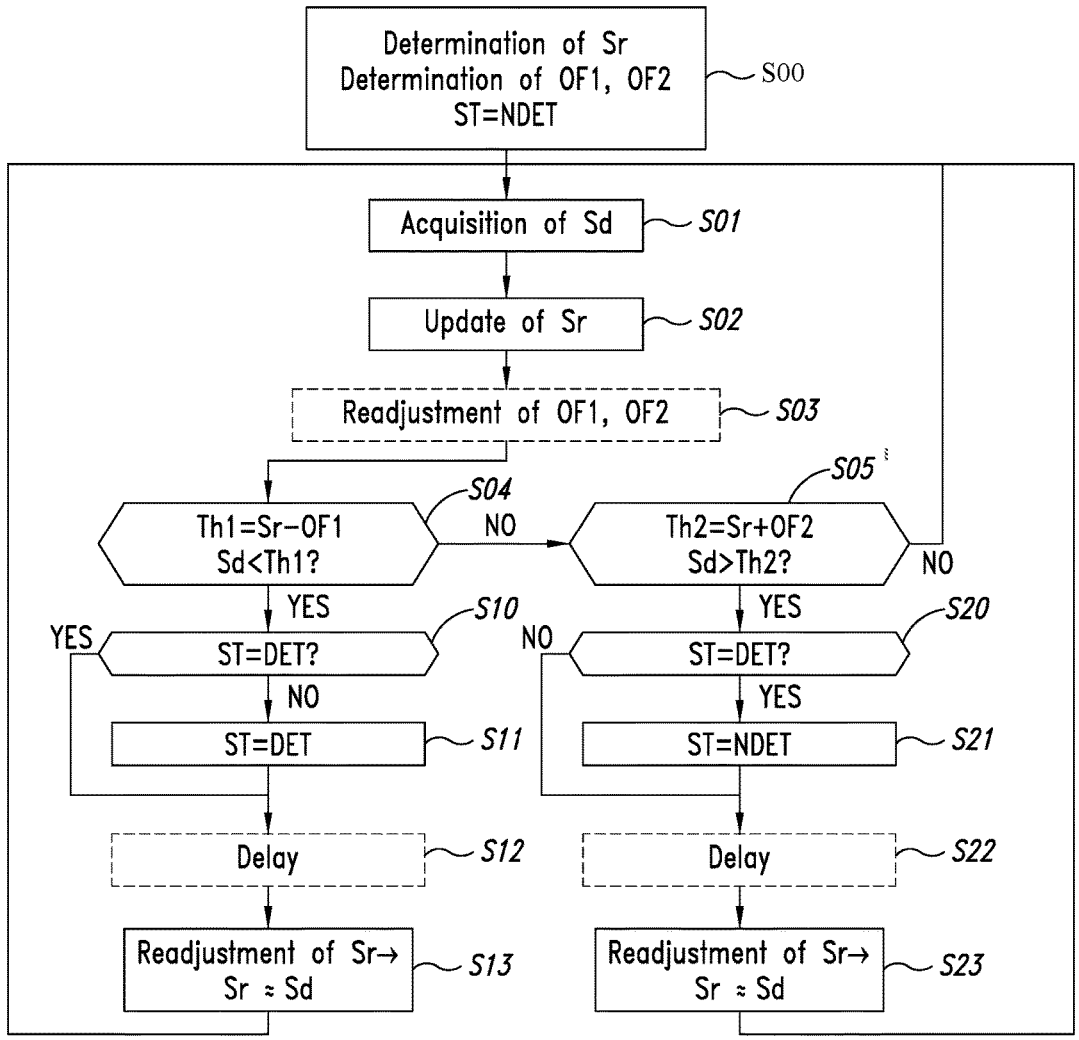
FIG. 8 is a flow chart describing a second embodiment of the method of the disclosure, and FIG. 9 schematically shows a portable object comprising a detector according to the disclosure.

FIG. 8 is a flow chart describing an implementation variation of the method in the case where sensor 10 supplies a detection signal Sd, the value of which decreases as the object approaches the sensor. This method is equivalent to that of FIG. 5 and only comprises an inversion of the position of thresholds Th1, Th2, threshold Th1 being arranged below the reference signal and threshold Th2 arranged above signal Sr. Thus, the steps shown in FIG. 8 are identical to those of FIG. 5, with the exception of step S04, which is replaced by a step S04', and of step S05, which is replaced by a step S05'.

At step S04', unit SPU2 calculates threshold Th1 and determines whether the current value of detection signal Sd is less than this threshold. Threshold Th1 is calculated here by subtracting offset OF1 from the current value of reference signal Sr, that is Th1=Sr−OF1. If signal Sd is less than Th1, unit SPU2 goes to step S10, otherwise it goes to step S05'.

At step S05', unit SPU2 calculates threshold Th2 and determines whether the current value of detection signal Sd is greater than this threshold. Threshold Th2 is calculated by adding offset OF2 to the current value of signal Sr, that is Th2=Sr+OF2. If signal Sd is greater than Th2, unit SPU2 goes to step S20, otherwise it returns to step S01.

It will clearly appear to the skilled person that the method of the disclosure may be implemented with any type of proximity sensor, including optical, supplying a detection signal having a value that increases, or respectively decreases, as a function of the proximity of the detected object. The method offers a particular advantage when the value of the detection signal is sensitive to environmental parameters.

Moreover, the term "filtering" designates, in the present application, any type of digital or analog processing allowing rapid variations of signal Sd to be filtered to obtain a reference signal Sr that follows, with a lag time, the slow variations of signal Sd, and which thus has the same value as signal Sd when it is not fluctuating. Methods based for example on the calculation of the ponderated average value of samples of signal Sd could also allow signal Sd to be supplied.

A detector according to disclosure is equally susceptible to diverse embodiments and applications. Unit SPU2 is not necessarily a dedicated calculation unit and may be the processor of a portable object in which sensor 10 is incorporated. In this case, the processor can be supplied with a program comprising an executable code allowing it to implement the method.

Furthermore, a detector according to disclosure may be made as a touch detector. The term "proximity detection" includes, in the present application, the term "touch detection".

Figure 9:
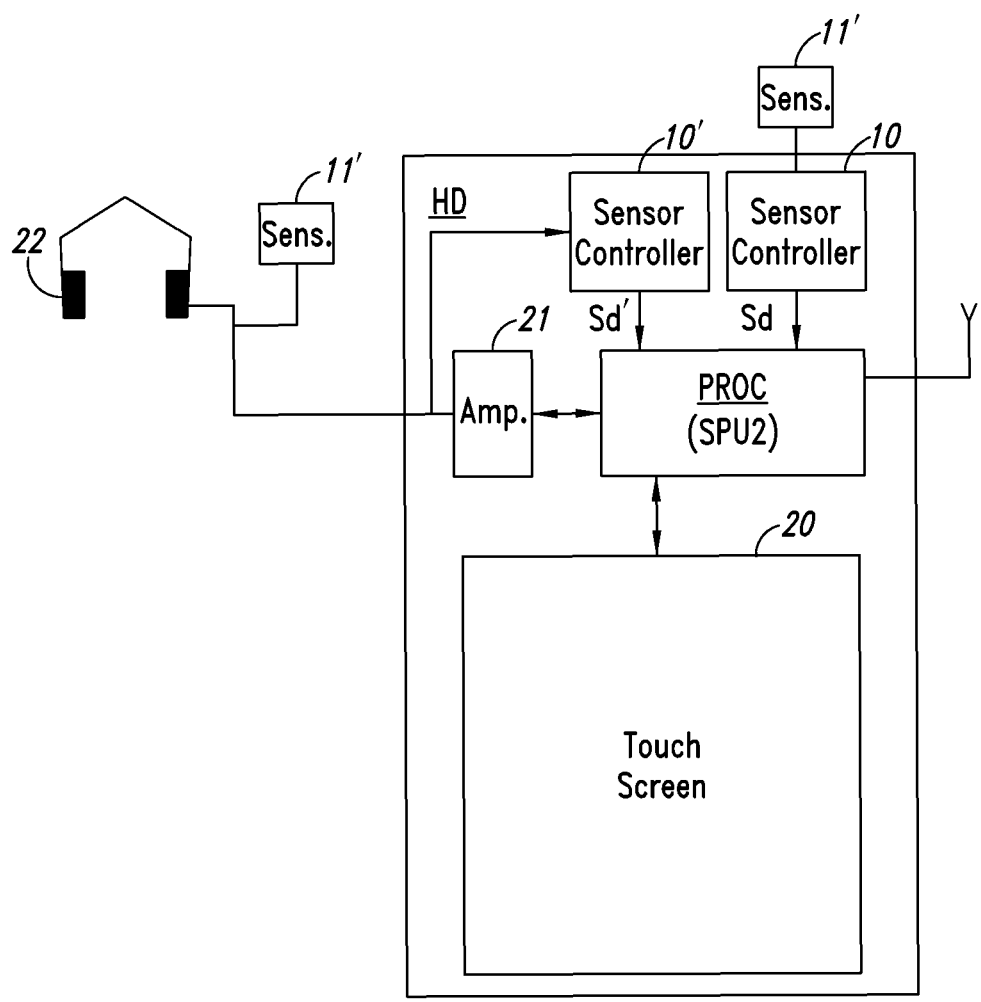

FIG. 9 schematically shows a portable object HD comprising a processor PROC and elements 20, 21 controlled by the processor. Element 20 is for example a touch screen and element 21 is for example an audio-frequency amplifier intended to be connected to headphones 22. Processor PROC is for example the baseband processor of a mobile telephone, the processor of an audio player, or of a PDA.

Portable object HD is equipped with a first proximity sensor 10 and a second proximity sensor 10'. Sensor 10 has a sensitive portion 11 arranged to detect the presence of a part of the body, for example the user's head, proximate the portable object HD. Sensor 10' has a sensitive portion 11' arranged in the headphones to detect whether or not the headphones are being worn by the user.

Processor PROC is used as processing unit SPU2 and receives an implementation program of a method according to disclosure of processing detection signals Sd, Sd' supplied by sensors 10, 10'. Processor PROC is also configured to activate or deactivate elements 20 and 21 according to state DET or NDET that it determines for each sensor 10, 10' from signals Sd, Sd'. Thus, if element 20 is a touch screen, processor PROC is configured to lock the screen when it detects, by means of sensor 10, that a user has placed the portable object against his head. If element 21 is an audio amplifier, processor PROC is configured to activate the amplifier when it detects, by means of sensor 10', that the user has placed the headphones on his head.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   detecting an object using a detection signal supplied by a proximity sensor, the detection signal having a value that changes as a function of the proximity of the object to the proximity sensor, the detecting including:
   generating a reference signal by filtering the detection signal;
   defining a first detection threshold relative to the reference signal;
   going from an object non-detecting state to an object detecting state in response to detecting a value of the detection signal crosses the first detection threshold in a first direction;
   in response to detecting the value of the detection signal crossing the first detection threshold in the first direction, readjusting a value of the reference signal based on the detection signal and setting the first detection threshold based on the readjusted value of the reference signal; and
   while in the object detecting state and after readjusting the value of the reference signal based on the detection signal and setting the first detection threshold based on the readjusted value of the reference signal:
   detecting that the detection signal again crosses the first detection threshold in the first direction; and
   again readjusting the value of the reference signal, in a manner such that the detection signal crosses the first detection threshold in a second direction, opposite to the first direction, in response to detecting that the detection signal again crosses the first detection threshold in the first direction.

2. The method according to claim 1, comprising:
   defining a second detection threshold relative to the reference signal,
   going from the object detecting state to the object non-detecting state in response to detecting that the detection signal crosses the second detection threshold in the second direction, and
   in response to detecting that the detection signal crosses the second detection threshold in the second direction, readjusting the value of the reference signal in a manner such that the detection signal crosses the second detection threshold in the first direction.

3. The method according to claim 2, comprising, while in the object detecting state and after readjusting the value of the reference signal in a manner such that the detection signal crosses the second detection threshold in the first direction:
   detecting that the detection signal again crosses the second detection threshold in the second direction; and
   again readjusting the value of the reference signal in a manner such that the detection signal again crosses the second detection threshold in the first direction in response to detecting that the detection signal again crosses the second detection threshold in the second direction, without modifying the non-detecting state.

4. The method according to claim 2, wherein defining the second detection threshold includes adding or subtracting an offset to the value of the reference signal.

5. The method according to claim 1, wherein defining the first detection threshold includes adding or subtracting an offset to the value of the reference signal.

6. The method according to claim 1, wherein defining the first detection threshold based on the readjusted value of the reference signal includes adjusting the offset and adding or subtracting the adjusted offset to the reference signal.

7. The method according to claim 1, wherein readjusting the value of the reference signal is done in a manner such that the detection signal is substantially equal to the value of the reference signal with a maximum deviation less than a difference between the value of the readjusted reference signal and the detection threshold, the crossing of which causes the readjusting of the reference signal.

8. The method according to claim 1, wherein the readjusting of the value of the reference signal is done from values of the detection signal after an instant when the detection signal crosses the first detection threshold in the first direction.

9. A method, comprising:
 detecting an object using a detection signal supplied by a proximity sensor, the detection signal having a value that changes as a function of the proximity of the object to the proximity sensor, the detecting including:
  generating a reference signal by filtering the detection signal;
  defining a first detection threshold relative to the reference signal, wherein defining the first detection threshold includes adding or subtracting an offset to the reference signal;
  going from an object non-detecting state to an object detecting state in response to detecting the detection signal crossing the first detection threshold in a first direction; and
  in response to detecting the detection signal crossing the first detection threshold in the first direction, readjusting a value of the reference signal based on the detection signal and setting the first detection threshold based on the readjusted value of the reference signal such that the detection signal again crosses the first detection threshold in a second direction opposite to the first direction, wherein setting the first detection threshold based on the readjusted value of the reference signal includes adjusting the offset and adding or subtracting the adjusted offset to the reference signal.

10. The method according to claim 9, comprising:
 defining a second detection threshold relative to the reference signal,
 going from the object detecting state to the object non-detecting state in response to detecting that the detection signal crosses the second detection threshold in the second direction, and
 in response to detecting that the detection signal crosses the second detection threshold in the second direction, readjusting the value of the reference signal in a manner such that the detection signal crosses the second detection threshold in the first direction.

11. The method according to claim 10, comprising, while in the object detecting state and after readjusting the value of the reference signal in a manner such that the detection signal crosses the second detection threshold in the first direction:
 detecting that the detection signal again crosses the second detection threshold in the second direction; and
 again readjusting the value of the reference signal in a manner such that the detection signal again crosses the second detection threshold in the first direction in response to detecting that the detection signal again crosses the second detection threshold in the second direction, without modifying the non-detecting state.

12. The method according to claim 10, wherein defining the second detection threshold includes adding or subtracting the offset to the value of the reference signal.

13. A non-transitory computer readable medium, comprising program code configured to cause one or more processors to implement a method that includes:
 detecting an object using a detection signal supplied by a proximity sensor, the detection signal having a value that changes as a function of the proximity of the object to the proximity sensor, the detecting including:
  generating a reference signal by filtering the detection signal;
  defining a first detection threshold relative to the reference signal;
  going from an object non-detecting state to an object detecting state in response to detecting a value of the detection signal crosses the first detection threshold in a first direction;
  in response to detecting the value of the detection signal crossing the first detection threshold in the first direction, readjusting a value of the reference signal based on the detection signal and setting the first detection threshold based on the readjusted value of the reference signal; and
  while in the object detecting state and after readjusting the value of the reference signal based on the detection signal and setting the first detection threshold based on the readjusted value of the reference signal:
   detecting that the detection signal again crosses the first detection threshold in the first direction; and
   again readjusting the value of the reference signal, in a manner such that the detection signal crosses the first detection threshold in a second direction, opposite to the first direction, in response to detecting that the detection signal again crosses the first detection threshold in the first direction.

14. The non-transitory computer readable medium according to claim 13, wherein:
 defining the first detection threshold includes adding or subtracting an offset to the value of the reference signal; and
 defining the first detection threshold based on the readjusted value of the reference signal includes adjusting the offset and adding or subtracting the adjusted offset to the reference signal.

15. The non-transitory computer readable medium according to claim 13, wherein the method comprises:
 defining a second detection threshold relative to the reference signal,
 going from the object detecting state to the object non-detecting state in response to detecting that the detection signal crosses the second detection threshold in the second direction, and
 in response to detecting that the detection signal crosses the second detection threshold in the second direction, readjusting the value of the reference signal in a manner such that the detection signal crosses the second detection threshold in the first direction.

16. The non-transitory computer readable medium according to claim 15, wherein the method comprises, while in the object detecting state:
 detecting that the detection signal again crosses the second detection threshold in the second direction; and
 again readjusting the value of the reference signal in a manner such that the detection signal again crosses the second detection threshold in the first direction in response to detecting that the detection signal again crosses the second detection threshold in the second direction, without modifying the non-detecting state.

17. A proximity detector comprising:
a proximity sensor configured to supply a detection signal having a value that changes based on a proximity of an object to the sensor; and
a processing unit configured to receive the detection signal, wherein the processing unit is configured to:
generate a reference signal by filtering the detection signal;
define a first detection threshold relative to the reference signal;
go from an object non-detecting state to an object detecting state in response to detecting the detection signal crossing the first detection threshold in a first direction;
in response to detecting the detection signal crossing the first detection threshold in the first direction, readjust a value of the reference signal based on the detection signal and setting the first detection threshold based on the readjusted value of the reference signal; and
while in the object detecting state and after readjusting the value of the reference signal based on the detection signal and setting the first detection threshold based on the readjusted value of the reference signal:
detecting that the detection signal again crosses the first detection threshold in the first direction; and
again readjusting the value of the reference signal, in a manner such that the detection signal crosses the first detection threshold in a second direction, opposite to the first direction, in response to detecting that the detection signal again crosses the first detection threshold in the first direction.

18. The proximity detector according to claim 17, wherein the proximity sensor includes a sensitive portion and a sensor controller configured to read and control the sensitive portion.

19. The proximity detector according to claim 17, wherein the processing unit is configured to:
define the first detection threshold by adding or subtracting an offset to the value of the reference signal; and
define the first detection threshold based on the readjusted value of the reference signal by adjusting the offset and adding or subtracting the adjusted offset to the reference signal.

20. A portable device, comprising:
a first element that can be activated and deactivated; and
a first proximity detector configured to activate or deactivate the first element when an object is detected in proximity of the device, the first proximity detector including:
a proximity sensor configured to supply a detection signal having a value that changes based on a proximity of an object to the sensor; and
a processing unit configured to receive the detection signal, wherein the processing unit is configured to:
generate a reference signal by filtering the detection signal;
define a first detection threshold relative to the reference signal;
go from an object non-detecting state to an object detecting state in response to detecting the detection signal crossing the first detection threshold in a first direction;
in response to detecting the detection signal crossing the first detection threshold in the first direction, readjust a value of the reference signal based on the detection signal and setting the first detection threshold based on the readjusted value of the reference signal; and
while in the object detecting state and after readjusting the value of the reference signal based on the detection signal and setting the first detection threshold based on the readjusted value of the reference signal:
detecting that the detection signal again crosses the first detection threshold in the first direction; and
again readjusting the value of the reference signal, in a manner such that the detection signal crosses the first detection threshold in a second direction, opposite to the first direction, in response to detecting that the detection signal again crosses the first detection threshold in the first direction.

21. The portable device according to claim 20, comprising:
a second element that can be activated and deactivated; and
a second proximity detector configured to activate or deactivate the second element when the object contacts the device.

22. The portable device according to claim 20, wherein the processing unit is configured to:
define the first detection threshold by adding or subtracting an offset to the value of the reference signal; and
define the first detection threshold based on the readjusted value of the reference signal by adjusting the offset and adding or subtracting the adjusted offset to the reference signal.

* * * * *